(12) United States Patent
Doman et al.

(10) Patent No.: US 8,859,416 B2
(45) Date of Patent: Oct. 14, 2014

(54) SOFTWARE AND METHOD FOR VIA SPACING IN A SEMICONDUCTOR DEVICE

(75) Inventors: David S. Doman, Austin, TX (US); Mahbub Rashed, Santa Clara, CA (US); Marc Tarrabia, Pleasant Valley, NY (US)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 228 days.

(21) Appl. No.: 13/454,928

(22) Filed: Apr. 24, 2012

(65) Prior Publication Data

US 2013/0280905 A1 Oct. 24, 2013

(51) Int. Cl.
*H01L 21/768* (2006.01)

(52) U.S. Cl.
USPC .......... 438/622; 257/774; 257/E23.145; 716/126; 716/119; 716/106; 716/55

(58) Field of Classification Search
USPC ........... 257/E23.145, 774; 438/622; 716/126, 716/119, 106, 55, 118
See application file for complete search history.

(56) References Cited

U.S. PATENT DOCUMENTS

| 7,655,483 | B2* | 2/2010 | Okuno | 438/17 |
| 8,381,162 | B2* | 2/2013 | Pelloie | 716/133 |
| 2006/0131575 | A1* | 6/2006 | Okuno | 257/48 |
| 2007/0118824 | A1* | 5/2007 | Bae et al. | 716/5 |
| 2009/0011596 | A1* | 1/2009 | Okuno | 438/682 |
| 2012/0081150 | A1* | 4/2012 | Pelloie | 326/101 |

* cited by examiner

*Primary Examiner* — Julio J Maldonado
*Assistant Examiner* — Jaehwan Oh
(74) *Attorney, Agent, or Firm* — Ingrassia Fisher & Lorenz, P.C.

(57) ABSTRACT

A computer-readable software product is provided for executing a method of determining the location of a plurality of power rail vias in a semiconductor device. The semiconductor device includes an active region and a power rail. Locations of a first via and a second via are assigned along the power rail. The spacing between the location of the first via and the location of the second via is a minimum spacing allowable. The spacing between the location of the second via and the locations of structures in the active region which may electrically interfere with the second via is determined. The location of the second via is changed in response to the spacing between the location of the second via and the location of one of the structures in the active region being less than a predetermined distance.

20 Claims, 7 Drawing Sheets

SOFTWARE AND METHOD FOR VIA SPACING IN A SEMICONDUCTOR DEVICE

FIELD OF THE INVENTION

The present invention generally relates to semiconductor devices, and more particularly relates to power rail vias in semiconductor devices.

BACKGROUND OF THE INVENTION

Semiconductor devices having standard cell library logic ("standard cells") often utilize a metal power rail to bring power and ground to the transistors forming the standard cells. In a common layout technique, standard cells are positioned above and below the power rail to maximize use of the power rail. A contact spine is typically disposed underneath and parallel to the power rail. A plurality of vias connects the metal rail to the contact spine. This contact spine is then electrically connected to contacts, which in turn, connect to the transistors.

Typically, the pitch of the vias (i.e., the spacing between the vias) is larger than the pitch of the gates of the transistors. Most often, the via pitch is double that of the gate pitch. However, the use of such a via pitch increases the resistance between the power rail and the transistors, thus reducing the electric performance of the transistors.

Accordingly, it is desirable to utilize a technique for more effective spacing between vias. Furthermore, other desirable features and characteristics of the present invention will become apparent from the subsequent detailed description of the invention and the appended claims, taken in conjunction with the accompanying drawings and this background of the invention.

BRIEF SUMMARY OF THE INVENTION

A method is provided for determining the location of a plurality of power rail vias in a semiconductor device. The semiconductor device includes an active region and a power rail. The method includes assigning a location of a first power rail via along the power rail. The method further includes assigning a location of a second power rail via along the power rail. A spacing between the location of the first power rail via and the location of the second power rail via is a minimum spacing allowable based on the lithography of the semiconductor device. The method also includes determining the spacing between the location of the second power rail via and the locations of structures in the active region which may electrically interfere with the second power rail via. The method further includes changing the location of the second power rail via in response to the spacing between the location of the second power rail via and the location of one of the structures in the active region being less than a predetermined distance. A computer-readable software product for executing the method is also provided.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

Figure 1:
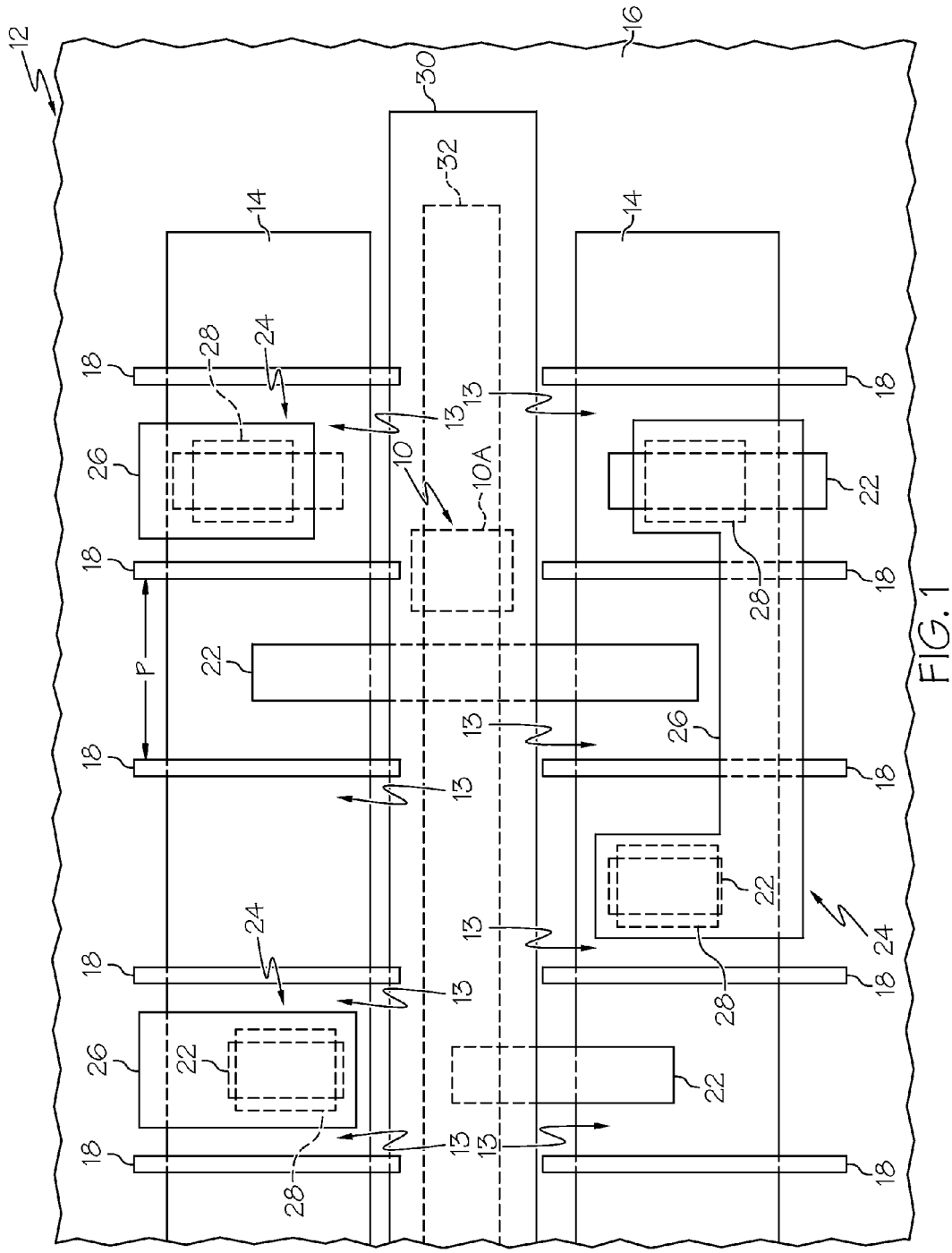
FIG. 1 is a top view of a semiconductor device showing a first power rail via placed along a power rail according to one embodiment of a method of determining locations of a plurality of power rail vias.

The following detailed description of the invention is merely exemplary in nature and is not intended to limit the invention or the application and uses of the invention. Furthermore, there is no intention to be bound by any theory presented in the preceding background of the invention or the following detailed description of the invention.

Referring to the figures, wherein like numerals indicate like parts throughout the several views, software and methods of determining the location of a plurality of power rail vias 10 in a semiconductor device 12 are shown and described herein. The semiconductor device 12 may be, for example, part of an integrated circuit, such as an application specific integrated circuit ("ASIC") or a microprocessor. Of course, other embodiments, applications, and uses for the semiconductor device 12 described herein are recognized by those skilled in the art.

The semiconductor device 12 of the illustrated embodiment includes a plurality of transistors 13 formed within an active region 14 of a semiconductor substrate 16. The transistors 13 may be connected together to create standard cell library logic devices (not shown), as is well known to those skilled in the art. Of course, the semiconductor device 12 may include a plurality of active regions 14.

In the illustrated embodiment, the transistors 13 are field-effect transistors (FETs) and more specifically, metal-oxide-semiconductor field-effect transistors (MOSFETs). Each of the transistors 13 includes a source (not shown), a drain (not shown), and a gate 18. The sources, drains, and gates may be formed in and/or on the substrate 16 using techniques that are well known to those skilled in the art. In the illustrated embodiment, the gates 18 are formed, for example, primarily of polycrystalline silicon, commonly referred to as polysilicon or simply PolySi, disposed above the substrate 16. As can be seen with reference to FIG. 1, the gates 18 of the illustrated embodiment are formed as linear strips (not separately numbered) generally parallel to one another.

The plurality of gates 18 defines a gate pitch P. That is, a generally standard distance, the gate pitch P, is defined between each of the gates 18. In the illustrated embodiment, where the gates 18 are formed primarily of polysilicon, the pitch P may be referred to as the contact poly pitch ("CPP").

The semiconductor device 12 includes a plurality of contacts 22 comprising an electrically conductive material, e.g., a metal. The contracts 22 are selectively connected to the sources, drains, and gates 18 of the transistors 13 for providing electrical connection to the transistor 13. As an example, one of the contacts 22 may electrically connect one transistor 13 to another transistor 13. As another example, one of the contacts 22 may electrically connect one of the transistors 13 to a power rail 30.

Figure 5:
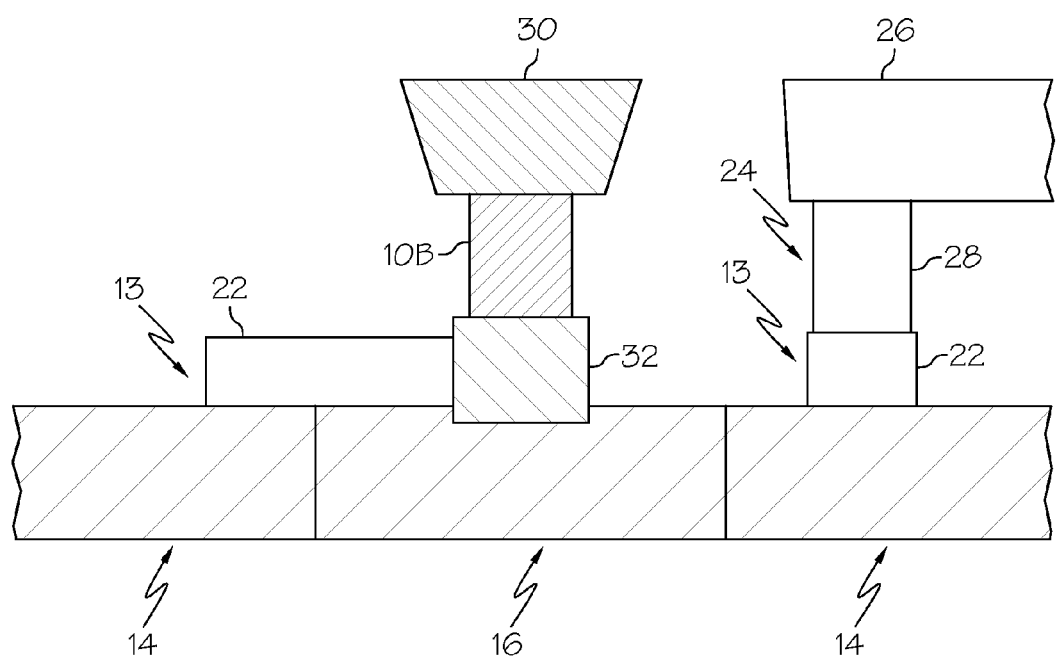
FIG. 5 is a cross-sectional side view of the semiconductor device along the line 5-5 in FIG. 4.

To facilitate connections between the various transistors 13, the semiconductor device 12 may include various interconnecting structures 24 disposed above the substrate 16. The structures 24 may include at least one conducting strip 26 to selectively interconnect one of the transistors 13 to another of the transistors 13. The conducting strip 26 includes an electrically conductive material, e.g., a metal. The conducting strip 26 may be referred to as a "metal layer". The interconnecting structures 24 may also include at least one active region via 28. In the illustrated embodiment, as shown in FIG. 5, the at least one active region via 28 supports the conducting strip 26 and electrically connects the conducting strip 26 to at least one of the contacts 22.

Figure 2:
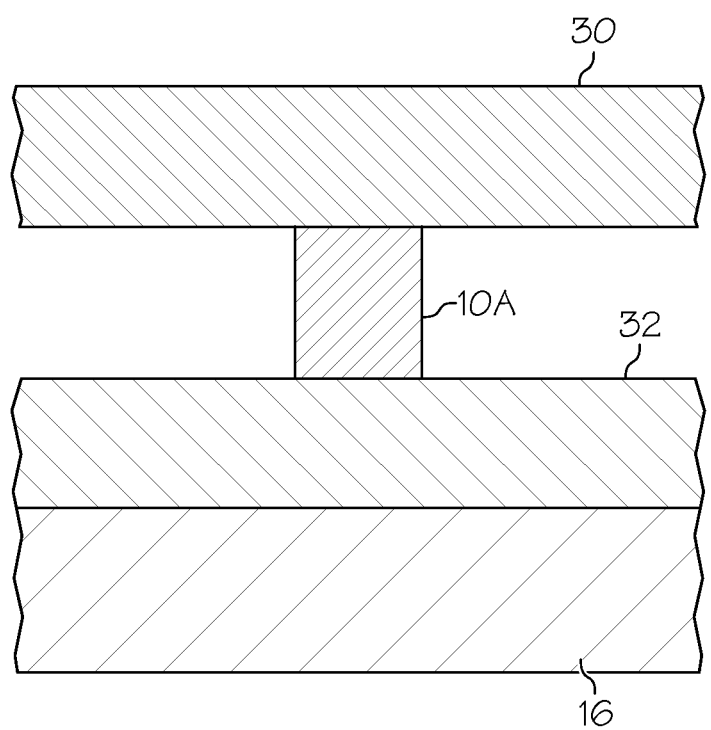
FIG. 2 is cross-sectional side view of the semiconductor device along the line 2-2 in FIG. 1 showing the first power rail via sandwiched between the power rail and a contact spline.

Referring to FIGS. 1 and 2, the semiconductor device 12 of the illustrated embodiment also includes the power rail 30 for supplying power to the transistors 13. The power rail 30 is disposed above the substrate 16 and includes an electrically conductive material. For example, the power rail 30 may be formed of a metal. As such, the power rail 30 may alternatively be referred to as a "metal rail" or "metal layer".

Figure 4:
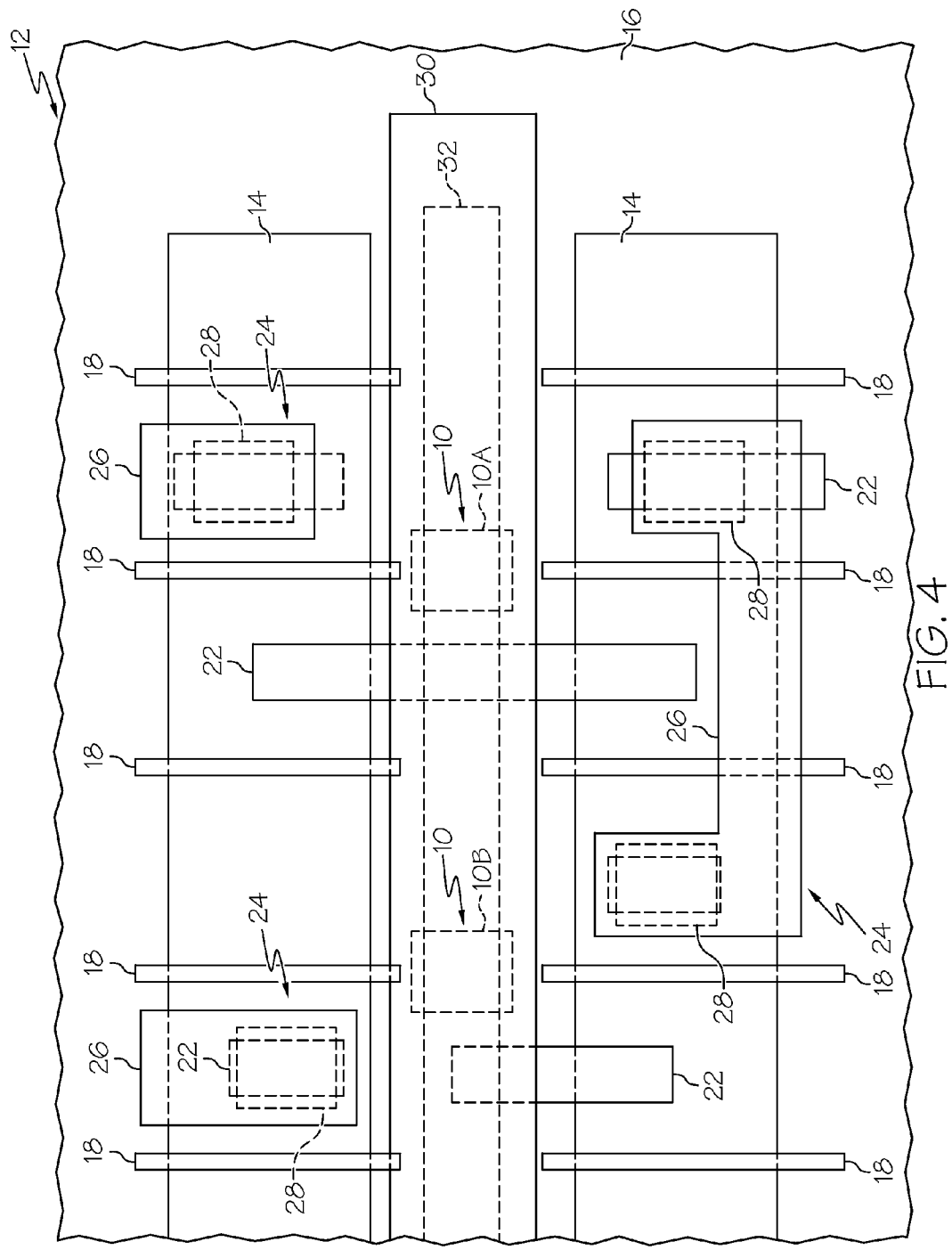
FIG. 4 is a top view of a semiconductor device showing the second power rail via after being moved according to one embodiment of the method.

The semiconductor device 12 of the illustrated embodiment further includes a contact spine 32. The contact spine 32 is disposed between the substrate 16 and the power rail 30. More specifically, in the illustrated embodiment, the contact spine 32 is disposed on the substrate 16. The contact spine 32 includes an electrically conductive material. As shown in FIGS. 4 and 5, the contact spine 32 may be electrically coupled to one or more of the contacts 22 to deliver power to and/or from the contacts 22, and consequently, the transistors 13. The electrical connection between the power rail 30 and the contact spine 32 is provided by the power rail vias 10. The power rail vias 10 also support the power rail 30 above the substrate 16.

In another embodiment (not shown), at least one of the power rail vias 10 may electrically connect the power rail 30 to/from at least one of the contacts 22 without utilizing the contact spine 32. In yet another embodiment (not shown), at least one of the power rail vias 10 may electrically connect the power rail 30 to/from at least one of the transistors 13 without utilizing the contact spine 32 or the contacts 22.

The method of determining the location of a plurality of power rail vias 10 may be implemented in a computer-readable software product (not shown). That is, the method described herein may be encoded as a series of computer executable codes. The software product has access to the topography of the semiconductor device 12 such that locations of the various components may be analyzed and compared.

The software and methods described herein may be integrated in an overall integrated circuit design program. In some embodiments (not shown), this program may automatically assign locations for the power rail vias 10 at a regular interval. In this case, the method begins with the step of removing at least some of the power rail vias 10. Specifically, the method includes the step of removal of all of the power rail vias 10.

The method proceeds with assigning a location of a first power rail via 10a along the power rail 30, as shown in FIG. 1. In one embodiment, the assigned location of the first power rail via 10a may be chosen randomly. In another embodiment, the assigned location of the first power rail via 10a may be chosen by some predetermined criteria. For example, the assigned location of the first power rail via 10a may be at a center of the power rail 30.

Figure 3:
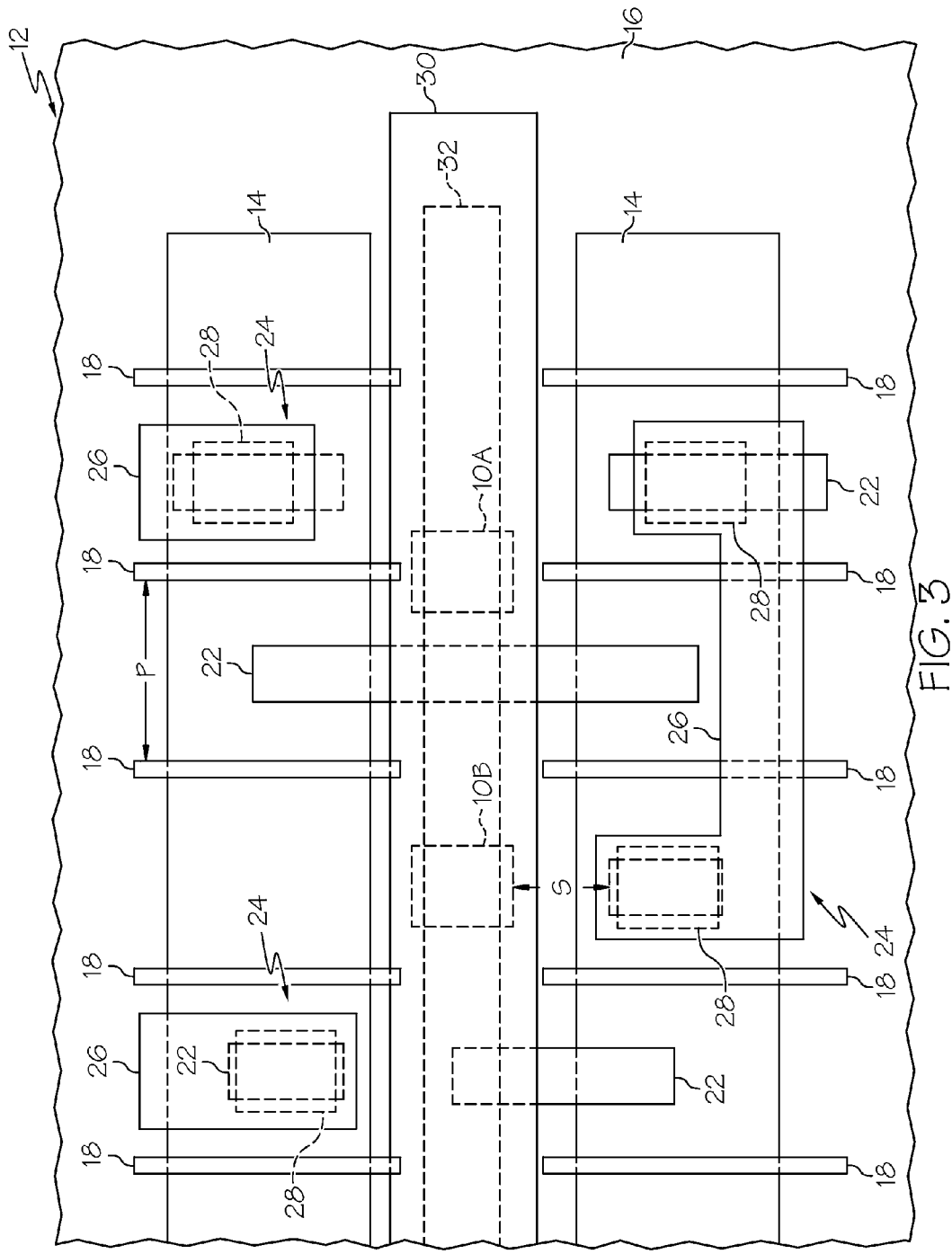
FIG. 3 is a top view of a semiconductor device showing a second power rail via placed along the power rail according to one embodiment of the method.

The method further includes assigning a location of a second power rail via 10b along the power rail 30, as shown in FIG. 3. The spacing between the location of the first power rail via 10a and the location of the second power rail via 10b is a predetermined distance. Specifically, in the illustrated embodiment, the predetermined distance is a minimum spacing allowable based on the lithography of the semiconductor device 12. For example, in the illustrated embodiment, the minimum spacing is about 1.5 times the gate pitch. Said another way, the distance between the first and second power rail vias 10a, 10b can be found by multiplying the distance between the gates 18 by 1.5.

It should be appreciated that numerous masks are often required to generate each power rail via 10a, 10b. As such, the minimum spacing between the first and second power rail vias 10a, 10b in other embodiments may be based on the limitations of multiple lithography processes.

By assigning the location of the second power rail via 10b as close as possible to the first power rail via 10a, the resistance between the power rail 30 and the transistors 13 is kept relatively low. By keeping this resistance relatively low, a higher electric performance of the transistors 13 is achieved when compared to prior art semiconductor devices, where power rail via spacing is greater.

However, minimizing the space between the power rail vias 10a, 10b may cause electrical conflicts with structures in the active region of the semiconductor device 12. As such, the method also includes determining the spacing S between the location of the second power rail via 10b and the locations of structures in the active region which may electrically interfere with the second power rail via 10b. For purposes of simplicity, these structures may be referred to herein as "potentially interfering structures" or simply "structures". These structures may include, but are certainly not limited to, the conducting strips 26 and the active region vias 28. Other potentially interfering structures will be appreciated by those skilled in the art.

If the spacing S between the location of the second power rail via 10b and the location of the potentially interfering structures is less than a predetermined distance, then the location of the second power rail via 10b is changed, as shown in FIG. 4. Said another way, the method includes changing the location of the second power rail via 10b in response to the spacing between the location of the second power rail via 10b and the location of one of the structures in the active region being less than a predetermined distance. The predetermined distance is determined based on several factors, including, but not limited to, the electrical characteristics (e.g., voltage) of the power carried by the second power rail via 10b, the composition of the second power rail via 10b and the structures, and the geometric properties (i.e., shape) of the second power rail via 10b and the structures. As such, the predetermined distance may actually be different for different locations at which the second power rail via 10b may be disposed.

The changing of the location of the second power rail 10b may be accomplished by moving the location of the second power rail via 10b away from the location of the first power rail via 10a along the power rail 30. In the illustrated embodiment, the second power rail via 10b is moved a predetermined distance from its previous location. More specifically, tin the illustrated embodiment, the location of the second power rail via 10b is moved by about ½ of the gate pitch P from its previous location. For example, if the gate pitch P is 19 nm, then the second power rail via 10b would be moved by about 9.5 nm from its previous location.

Once the location of the second power rail via 10b has been moved, the spacing between the changed location of the second power rail via 10*b* and the locations of the potentially interfering structures in the active region is again determined. If the spacing between the changed location of the second power rail via 10*b* and the location of the potentially interfering structures is still less than the predetermined distance, then the location of the second power rail via 10*b* is once again changed. The steps of changing the location of the second power rail via 10*b* and determining the spacing between the second power rail via 10*b* may be repeated until the spacing is greater than the predetermined distance.

Figure 6:
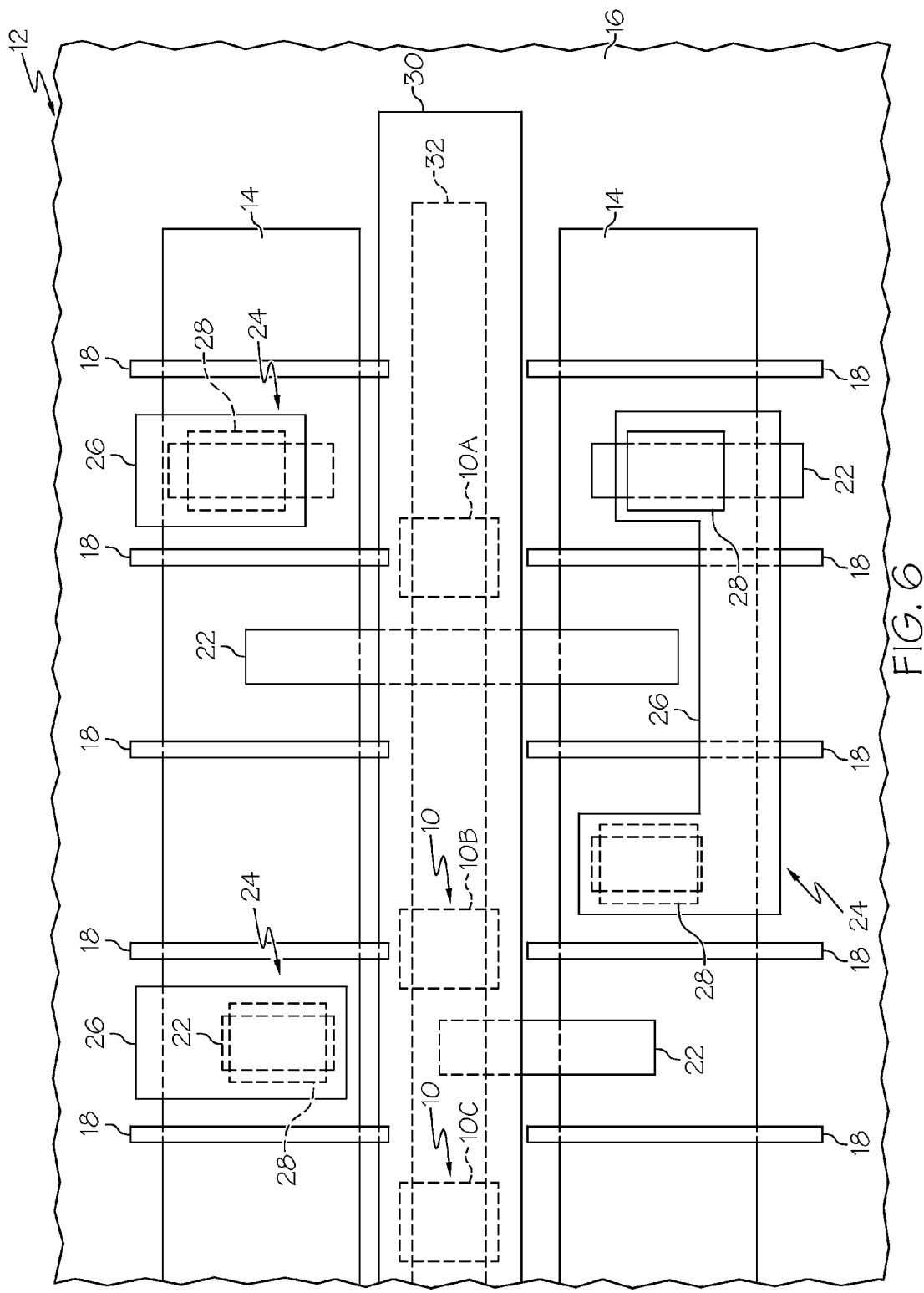
FIG. 6 is a top view of a semiconductor device showing a third power rail via placed along the power rail according to one embodiment of the method.
Figure 7:
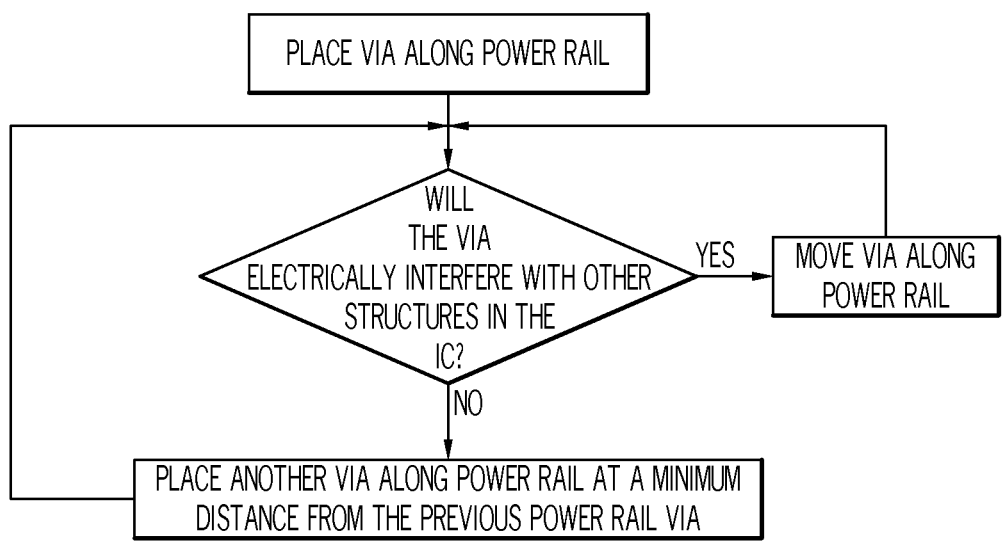
FIG. 7 is a schematic diagram illustrating one embodiment of the method.

Various steps of the method may be repeated to add additional power rail vias 10. For example, as shown in FIG. 6, the method may include assigning a location of a third power rail via 10*c* along the power rail 20. The spacing between the location of the second power rail via 20*b* and the location of the third power rail via 10*c* is the minimum spacing allowable based on the lithography of the semiconductor device 12. The method may further include determining the spacing between the location of the third power rail via 10*c* and the locations of the structures in the active region 14 which may electrically interfere with the third power rail via 10*c*. The method may also include changing the location of the third power rail via 10*c* in response to the spacing between the location of the third power rail via 10*c* and the location of one of the structures in the active region being less than a predetermined distance. A simplified flowchart of one embodiment of the method is shown in FIG. 7.

The software and methods of determining the location of the plurality of power rail vias 10 in the semiconductor device 12, as described above, may be utilized in the fabrication of the semiconductor device 12. Specifically, a method of fabricating the semiconductor device 12 includes forming the plurality of transistors 13 in the active region 14 of the substrate 16. Techniques for forming the plurality of transistors 13 are well known to those skilled in the art and therefore will not be discussed further.

The method of fabricating the semiconductor device 12 further includes determining a location of the power rail 30 to supply electrical power to the transistors 13. In the illustrated embodiments, for example, the power rail 30 is located between a pair of active regions 14 such that the power rail 30 may supply power to transistors 13 in both active regions 14.

The method of fabricating the semiconductor device 12 further includes disposing the power rail vias 10 on the substrate 16. Specifically, the power rail vias 10 are disposed at or near the locations determined above. The power rail vias 10 are at least partially formed from an electrically conductive material, e.g., a metal. In the illustrated embodiment, the power rail vias 10 are disposed on the contact spine 32, instead of directly on the substrate 16.

The method of fabricating the semiconductor device 12 also includes disposing the power rail 30 above the substrate 16, such that the power rail 30 is supported by the power rail vias 10. The power rail 30 is at least partially formed of an electrically conductive material, e.g., a metal. The method of fabricating the semiconductor device 12 may also include disposing the contact spine 32 on the substrate 16 and below the power rail 30.

While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims and their legal equivalents.

The invention claimed is:

1. A method of determining the location of a plurality of power rail vias in a semiconductor device, wherein the semiconductor device includes an active region and a power rail, wherein the power rail includes the power rail vias, said method comprising:
   assigning a location of a first power rail via along the power rail;
   assigning a location of a second power rail via along the power rail, wherein a spacing between the location of the first power rail via and the location of the second power rail via is a minimum spacing allowable;
   determining the spacing between the location of the second power rail via and the locations of structures in the active region which may electrically interfere with the second power rail via; and
   changing the location of the second power rail via in response to the spacing between the location of the second power rail via and the location of one of the structures in the active region being less than a predetermined distance.

2. A method as set forth in claim 1 wherein said changing the location of the second power rail via comprises moving the location of the second power rail via away from the location of the first power rail via along the power rail.

3. A method as set forth in claim 2 wherein said moving the location of the second power rail via comprises moving the location of the second power rail via away from the location of the first power rail via by a predefined distance along the power rail.

4. A method as set forth in claim 2 wherein the active region includes a plurality of gates defining a pitch and wherein said moving the location of the second power rail via comprises moving the location of the second power rail via away from the location of the first power rail via by about ½ the pitch along the power rail.

5. A method as set forth in claim 1 further comprising determining the spacing between the location of the second power rail via and the locations of the structures in the active region which may electrically interfere with the second power rail via in response to the location of the second power rail via being changed.

6. A method as set forth in claim 5 further comprising again changing the location of the second power rail via in response to the spacing between the location of the second power rail via and the location of one of the structures in the active region being less than a predetermined distance.

7. A method as set forth in claim 1 further comprising:
   assigning a location of a third power rail via along the power rail, wherein a spacing between the location of the second power rail via and the location of the third power rail via is the minimum spacing allowable;
   determining the spacing between the location of the third power rail via and the locations of the structures in the active region which may electrically interfere with the third power rail via; and
   changing the location of the third power rail via in response to the spacing between the location of the third power rail via and the location of one of the structures in the active region being less than a predetermined distance.

8. A computer-readable software product for executing a method of determining the location of a plurality of power rail vias in a semiconductor device, wherein the semiconductor device includes an active region and a power rail, wherein the power rail includes the power rail vias, the method comprising:

assigning a location of a first power rail via along the power rail;

assigning a location of a second power rail via along the power rail, wherein a spacing between the location of the first power rail via and the location of the second power rail via is a minimum spacing allowable;

determining the spacing between the location of the second power rail via and the locations of structures in the active region which may electrically interfere with the second power rail via; and changing the location of the second power rail via in response to the spacing between the location of the second power rail via and the location of one of the structures in the active region being less than a predetermined distance.

9. A software product as set forth in claim 8 wherein said changing the location of the second power rail via comprises moving the location of the second power rail via away from the location of the first power rail via along the power rail.

10. A software product as set forth in claim 9 wherein said moving the location of the second power rail via comprises moving the location of the second power rail via away from the location of the first power rail via by a predefined distance along the power rail.

11. A software product as set forth in claim 9 wherein the active region includes a plurality of gates defining a pitch and wherein said moving the location of the second power rail via comprises moving the location of the second power rail via away from the location of the first power rail via by about ½ the pitch along the power rail.

12. A software product as set forth in claim 8 further comprising determining the spacing between the location of the second power rail via and the locations of the structures in the active region which may electrically interfere with the second power rail via in response to the location of the second power rail via being changed.

13. A software product as set forth in claim 12 further comprising again changing the location of the second power rail via in response to the spacing between the location of the second power rail via and the location of one of the structures in the active region being less than a predetermined distance.

14. A software product as set forth in claim 8 further comprising:

assigning a location of a third power rail via along the power rail, wherein a spacing between the location of the second power rail via and the location of the third power rail via is the minimum spacing allowable;

determining the spacing between the location of the third power rail via and the locations of the structures in the active region which may electrically interfere with the third power rail via; and changing the location of the third power rail via in response to the spacing between the location of the third power rail via and the location of one of the structures in the active region being less than a predetermined distance.

15. A method of fabricating a semiconductor device, comprising forming a plurality of transistors in an active region of a substrate;

determining a location of a power rail to supply electrical power;

determining locations of a plurality of power rail vias to couple the power rail to the transistors, wherein determining the locations of the power rail vias includes:

assigning a location of a first power rail via along the power rail, assigning a location of a second power rail via along the power rail, wherein a spacing between the location of the first power rail via and the location of the second power rail via is a minimum spacing allowable, determining the spacing between the location of the second power rail via and the locations of structures in the active region which may electrically interfere with the second power rail via, and changing the location of the second power rail via in response to the spacing between the location of the second power rail via and the location of one of the structures in the active region being less than a predetermined distance; and disposing the power rail and the power rail vias at the determined locations on the substrate.

16. A method as set forth in claim 15 wherein said changing the location of the second power rail via comprises moving the location of the second power rail via away from the location of the first power rail via along the power rail.

17. A method as set forth in claim 16 wherein said moving the location of the second power rail via comprises moving the location of the second power rail via away from the location of the first power rail via by a predefined distance along the power rail.

18. A method as set forth in claim 16 wherein the active region includes a plurality of gates defining a pitch and wherein said moving the location of the second power rail via comprises moving the location of the second power rail via away from the location of the first power rail via by about ½ the pitch along the power rail.

19. A method as set forth in claim 15 further comprising determining the spacing between the location of the second power rail via and the locations of the structures in the active region which may electrically interfere with the second power rail via in response to the location of the second power rail via being changed.

20. A method as set forth in claim 19 further comprising again changing the location of the second power rail via in response to the spacing between the location of the second power rail via and the location of one of the structures in the active region being less than a predetermined distance.

* * * * *